(12) United States Patent
Gidon et al.

(10) Patent No.: US 9,202,840 B2
(45) Date of Patent: Dec. 1, 2015

(54) PHOTODETECTING DEVICE HAVING SEMICONDUCTOR REGIONS SEPARATED BY A POTENTIAL BARRIER

(71) Applicant: COMMISSARIAT A L'ENERGIE ATOMIQUE ET AUX ENE ALT, Paris (FR)

(72) Inventors: Pierre Gidon, Echirolles (FR); Norbert Moussy, Sainte Agnes (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/451,648

(22) Filed: Aug. 5, 2014

(65) Prior Publication Data

US 2015/0060965 A1    Mar. 5, 2015

(30) Foreign Application Priority Data

Sep. 4, 2013    (FR) ...................... 13 58460

(51) Int. Cl.
*H01L 27/146*    (2006.01)
*H01L 31/103*    (2006.01)

(52) U.S. Cl.
CPC ...... *H01L 27/14643* (2013.01); *H01L 27/1461* (2013.01); *H01L 27/1464* (2013.01); *H01L 27/14607* (2013.01); *H01L 27/14627* (2013.01); *H01L 27/14636* (2013.01); *H01L 31/1037* (2013.01)

(58) Field of Classification Search
CPC .................. H01L 27/14643; H01L 27/14627; H01L 27/14625; H01L 27/14612; H01L 27/14621; H01L 27/14636; H01L 27/14806; H01L 29/0649
USPC ........... 257/222, 223, 233, E27.132, E27.133
See application file for complete search history.

(56) References Cited

U.S. PATENT DOCUMENTS

| 2002/0121652 A1 | 9/2002 | Yamasaki |
| 2007/0210395 A1* | 9/2007 | Maruyama et al. ........... 257/431 |
| 2011/0019049 A1* | 1/2011 | Jin et al. ........................ 348/308 |

(Continued)

FOREIGN PATENT DOCUMENTS

| EP | 2 618 377 A2 | 7/2013 |
| JP | 2001-250931 | 9/2001 |

OTHER PUBLICATIONS

French Preliminary Search Report issued Dec. 6, 2013 in French Application 13 58460, filed on Sep. 4, 2013 (with English Translation of Categories of Cited Documents).

*Primary Examiner* — Selim Ahmed
*Assistant Examiner* — Wasiul Haider
(74) *Attorney, Agent, or Firm* — Oblon, McClelland, Maier & Neustadt, L.L.P.

(57) ABSTRACT

Photodetecting device comprising:
  a semiconductor layer doped according to a first type of conductivity;
  two first semiconductor portions doped according to a second type of conductivity opposed to the first type of conductivity, distinct and separated from one another, and arranged in the semiconductor layer next to one another;
  a second semiconductor portion doped according to the first type of conductivity with a level of doping greater than that of the semiconductor layer and delimiting, with the semiconductor layer, the first portions by forming p-n junctions,
wherein a part of the semiconductor layer separates the first portions such that the depletion zones between the first portions form a potential barrier of which the level is less than the potential of the second portion and of the semiconductor layer.

15 Claims, 10 Drawing Sheets

(56) References Cited

U.S. PATENT DOCUMENTS

| | | | |
|---|---|---|---|
| 2013/0076953 A1* | 3/2013 | Sekine | 348/311 |
| 2013/0082343 A1* | 4/2013 | Fudaba et al. | 257/432 |
| 2013/0083230 A1 | 4/2013 | Fukuda | |
| 2013/0134299 A1* | 5/2013 | Romero et al. | 250/216 |

* cited by examiner

PHOTODETECTING DEVICE HAVING SEMICONDUCTOR REGIONS SEPARATED BY A POTENTIAL BARRIER

TECHNICAL FIELD AND PRIOR ART

The invention relates to the field of photodetectors used in particular for producing CMOS-type image sensors, as well as an image sensor comprising photodetecting devices according to the invention.

A CMOS image sensor comprises a pixel matrix, each pixel comprising a photodetecting device. One of the pixels of a CMOS image sensor 10 is diagrammatically shown as a cross-section in FIG. 1, with the structures of the other pixels of the sensor 10 being similar to that of the pixel shown on this figure. This pixel comprises a photodetecting device 11 comprising a photodetecting zone made in a semiconductor layer 12, for example of p doped silicon. This photodetecting zone comprises an n doped first region 14 of the layer 12, and a p+ doped second region 16 of the layer 12. Electrical interconnections levels 18 are made above the layer 12. These electrical interconnections levels 18 comprise in particular connection electrical lines, conducting vias electrically connecting the various connection electrical lines, as well as MOS transistor gates of the sensor 10. These levels of electrical interconnections are made in transparent dielectric layers 26, for example $SiO_2$-based. A transfer gate 20 made in the electrical interconnections levels 18 is coupled to the photodetecting zone (each pixel further comprises other transistors not shown in FIG. 1). This transfer gate 20 makes it possible to transfer the photogenerated charges, separated by the p-n junction and stored in the region 14, to another n doped region 15 of the layer 12. Various reading circuits are possible. These circuits are generally designated by the number of transistors required for reading a photodetecting zone. Reference is made for example to a 3T or 4T reading circuit for a reading circuit with 3 or 4 transistors. In order to carry out the reading of several photodetecting zones, it is possible to mutualise some of the transistors between the various reading circuits, thanks to a sequential reading of the photodetecting zones. For example, for 4 pixels operating with 4T reading circuits, it is possible to only call upon 6 transistors in order to make these 4 reading circuits, i.e. 1.5 transistors per pixel.

The photodetecting device 11 further comprises an optics arranged across from the photodetecting zone. This optics comprises a microlens 22 able to focus luminous rays 27 received by the pixel on the photodetecting zone of the pixel, and a coloured filter 24 belonging to a Bayer matrix. A region 28 of these transparent dielectric layers 26 located across from the photodetecting zone, between the photodetecting zone and the coloured filter 24, does not comprise any electrical interconnections so that the luminous rays coming from this optics can arrive in the photodetecting zone of the pixel without reflection on the electrical interconnections levels. The image sensor 10 is of the "front-side" type, i.e. it comprises the electrical interconnections levels 18 arranged between the photodetecting zones of the pixels and the optics through which the light enters.

Each of the photodetecting zones of the sensor 10 forms an electrical storage capacity. The photogenerated electrical charges are stored in this capacity during the integration time of the image, corresponding to the idle time of the sensor 10. The number of electrical charges that can be stored in the photodetecting zone is limited by various physical constraints and in particular by the size of the photodetecting zone. Once the integration time is completed, the transfer gates 20 are actuated and the signals outputted by the photodetecting zones corresponding to the stored electrical charges are then transferred into a smaller capacity, as such amplifying the voltage seen which is then multiplexed in a read chain making it possible to extract the information corresponding to the captured image. A new image can then be captured by the sensor 10.

The regions 14 and 16 of the photodetecting zone as well as the semiconductor of the layer 12 located around the region 14 together form metallurgic junctions, or p-n junctions, where the photons absorbed generate positive and negative charges. These charges are separated by the electric field of the p-n junction and integrated into the photodiode formed by the photodetecting zone, then read by the reading system.

The photodetecting zones of the sensor 10 have rather blurry or progressive limits, linked to the carrier diffusion phenomena and to the various potentials present in the structure. The charge storage zone of the photodetecting zone of the photodetecting device 11 is for example shown in FIG. 2. The n doped first region 14 is surrounded by a set of p-n junctions formed by the interface between the regions 14 and 16 and the interfaces between the first region 14 and the layer 12.

These junctions form a diode which, if it is reverse-biased, does not pass any current. The reverse bias voltage remains if no other phenomenon displaces charges. There is, in the vicinity of the p-n junctions, a zone 32 wherein the potential varies according to a continuous slope ranging from the potential of the second region 16 (which is equal to the potential in the p doped semiconductor of the layer 12) to the potential of the first region 14, or inversely. This zone 32, referred to as depletion zone, is symbolically delimited by a dotted line in FIG. 2.

FIG. 3 shows the potential obtained in the various elements of the photodetecting zone of FIG. 2 along the axis AA. The profile of this potential forms a well for the electrical charges between a first value $E_1$ corresponding to the potential in the second region 16 and in the layer 12, to a second value $E_2$, less than $E_1$ and corresponding to the potential in the first region 14. The edges of this well are diagrammed by slopes corresponding to the variations in the potential in the zone 32, and corresponding to regions wherein an electric field is established. These slopes are different according to the absolute value of the dopings of the semiconductors where this zone is located. The stronger the doping is (as for example the p+ doping of the second region 16 in relation to p doping of the layer 12), the more the distance over which extends the potential variation is low. The potential well therefore has a dimension that is greater than the n doped first region 14, extends largely in the p doped semiconductor of the layer 12, hardly in the p+ doped semiconductor of the second region 16 and its lowest point is inside the n doped first region 14.

The positive and negative charges photogenerated by the light received in the photodetecting zone have a certain lifespan before recombining. If they are generated in the zone p (layer 102) outside of the potential well, they will diffuse in the material, to the zones where the density of positive and negative charges is the lowest, for example to the edge of the well where they are separated by the electric field, preventing them from recombining. If the charges are generated in the well, which is relatively narrow, the charges then diffuse here also to the edge of the well. With the dopings indicated here, the charges with a − sign (electrons) are stored in the potential well, those of the other sign + (holes) remain outside of the well. The potential well decreases as it is filled by the electrons until it saturates and can no longer store any additional charges.

The maximum depth of the well depends on the doping level of the semiconductors. The reverse bias cannot remove more charges than there are n-type dopant atoms in this configuration. Typical dopings are as follows: p doping: a few $10^{15}$ atoms/cm$^3$; n doping: about $10^{17}$ atoms/cm$^3$; p+ doping: a few $10^{18}$ atoms/cm$^3$.

In the field of image sensors, in order to improve the resolution of the images captured, it is sought to increasingly miniaturise the pixels in order to have the highest number of pixels for a given surface of the sensor. This miniaturisation of the pixels is however accompanied by constraints linked to the physical phenomena bringing into play in the sensor. Indeed, the sensitivity of a pixel depends on its signal-to-noise ratio. However, there is a noise, referred to as photon noise, which is the consequence of a statistical phenomenon and of which the value depends on the root function of the number of photons received.

For the same external lighting at the sensor, the same idle time and the same optics, a pixel receives a quantity of photons proportional to its surface. As such, the more the surface of the pixel, and therefore the surface of the photodetecting zone, is small (surface in the plane (X, Y) shown in FIG. 1, parallel to a main plane of the layer 12), the more the number of photons received and electrons stored decreases. A reduction in the surface of the pixel therefore reduces the photonic signal-to-noise ratio of the sensor, with the sensitivity of the sensor becoming in this case poor.

In addition, by reducing the size of pixels, the electrical charge storage zone becomes smaller for the same internal electric field in the junctions of the pixels. This charge storage zone can therefore retain less charges, which limits the dynamics of the sensor (in terms of luminosity, resulting, in the images captured, in under-exposed black pixels and over-exposed white pixels).

In addition, by reducing the surface of the pixels, the absorption coefficient of the light by the filters or the semiconductor does not change. The pixel therefore has less surface in the plane (X,Y) but its thickness (dimension according to the axis Z) decreases little. With thickness of optics and electrical interconnections that hardly change, optical angle of view problems appear, the pixel then having a narrower acceptance cone of the luminous rays, which has several harmful consequences on the performances of the optics system. FIG. 4 diagrammatically represents a cross-section view of a portion of an image sensor 30 with a structure similar to the image sensor 10, but for which the surfaces of the pixels, in the plane (X, Y), i.e. the plane substantially perpendicular to the average angle of the luminous rays received by the image sensor 30, have been reduced. This reduction of the size of pixels results in particular in a reduction of the dimensions, in the plane (X,Y), of the optics (of the microlenses 22 and of the filters 24 in this example) and of the photodetecting zones (in particular regions 14 and 16 in this example). The angle of acceptance α of a pixel of the image sensor 30 is smaller than that of a pixel of the image sensor 10 (angle of acceptance β in FIG. 1). This also results in phenomena of vignetting of the captured image (darkening at the periphery of the image).

In addition, by reducing the sizes of the pixels, an increase is observed in the diffraction of the light waves in the photodetecting device 11 due to the dimensions of the elements of the device are of the same magnitude as the wavelengths of the light captured. This diffraction generates crosstalk problems.

In order to resolve the problems linked to the narrow angle of acceptance of the sensor, it is possible to make an image sensor 40 of the "back-side" type such as shown diagrammatically as a cross-section in FIG. 5. In such an image sensor 40, the electrical interconnections levels 18 are made on the side of a face of the semiconductor layer 12 opposite that through which the light enters.

Due to the fact that the light does not pass through the electrical interconnections levels 18, the optics system of such a pixel is therefore less directive than in the case of the image sensor 30, in considering equivalent pixel dimensions, due to the fact that the acceptance cone of luminous rays is in this case more substantial (angle of acceptance γ of the sensor 40 greater than the angle α of the sensor 30). However, this "back-side" image sensor 40 is more expensive to make than an image sensor of the "front-side" type and does not make it possible to resolve the problems of the dynamics of the sensor. The crosstalk problems can be resolved partially by the making of barriers (trenches) between the pixels. However, this also implies an increase in the cost of making the sensor.

It is possible to partially offset the problems of photonic signal-to-noise ratio by changing the main optics system in front of the image sensor (not shown in the preceding FIGS. 1 to 5) located far in front of the pixels, via the use of more open optics bringing more photons in the image sensor or by resolving the problems of filtering optics. This however entails a substantial increase in the cost of the sensor.

DESCRIPTION OF THE INVENTION

There is therefore a need to propose a photodetecting device that can in particular be used within an image sensor, making it possible to resolve at least partially the problems arised by image sensors of prior art disclosed hereinabove, and making it possible to improve the quality of the images captured without having to miniaturise the pixels or increase the cost of an image sensor comprising such photodetecting devices.

For this, an embodiment proposes a photodetecting device comprising at least:
  a semiconductor layer doped according to a first type of conductivity;
  two first semiconductor portions doped according to a second type of conductivity opposed to the first type of conductivity, distinct and separated from one another, and arranged in the semiconductor layer next to one another;
  a second semiconductor portion doped according to the first type of conductivity with a level of doping greater than that of the semiconductor layer and delimiting, with the semiconductor layer, the first semiconductor portions such that the first semiconductor portions form, with the semiconductor layer and the second semiconductor portion, p-n junctions,
wherein at least one part of the semiconductor layer doped according to the first type of conductivity separates the first semiconductor portions in such a way that depletion zones between the first semiconductor portions form at least one potential barrier of which the level is less than the potential level of the second semiconductor portion and of the semiconductor layer.

As such, contrary to the conventional approach for improving the quality of the images captured via a reduction in the dimensions of the photodetecting devices with the purpose of being able to multiply the number of pixels for a given surface of an image sensor, the photodetecting device described here comprises an architecture making it possible to obtain, thanks to the photodetecting "subzones" each formed by one of the first semiconductor portions, the semiconductor layer and the second semiconductor portion, several different pieces of information from a single pixel. These various pieces of information correspond in particular to the total sum of the electrical charges generated by the set of p-n junctions of the photodetecting device, as well as the manner in which the photogenerated charges are distributed within the various photodetecting subzones, i.e. the location of the charges in the various potential wells formed by the first semiconductor portions. These different pieces of information make it possible for example, through one or several calculations made using this information, to provide improvement to the image supplied by the pixels, via a digital exploitation of this information obtained from each pixel. It is therefore no longer required to miniaturise the pixels as much, which makes it possible to avoid all of the optical problems linked to the miniaturisation of the pixels.

Such a photodetecting device comprises a zone for photodetecting and for storing particular structure wherein the metallurgic junctions are organised differently from those of the zones for the photodetecting of the image sensors of prior art. The photodetecting zone is here divided into several photodetecting subzones, each formed by one of the first semiconductor portions which, surrounded by the other portions of semiconductor and of the semiconductor layer, form a p-n junction on the periphery of said first semiconductor portion. Each of the first semiconductor portions forms a potential well, with these wells being separated from each other by an electrical potential barrier of which the level is less than the potential level of the second semiconductor portion and of the semiconductor layer. These photodetecting subzones are therefore in electrical contact with one another during a capture of images.

As such, when one of the photodetecting subzones approaches saturation of charges during an image capture, these charges pass the potential barrier or barriers which are the lowest and go in the adjacent photodetecting subzone or subzones. As such, within a pixel, all of the photodetecting subzones can store at most practically as many electrical charges as the single conventional photodetecting zone of one pixel according to prior art, for the same pixel dimension. A sum of the signals extracted from the various photodetecting subzones of the pixel therefore makes it possible to obtain a signal similar to that supplied by a pixel of prior art of equivalent dimensions, corresponding to the sum of the photogenerated charges in the pixel.

The photogenerated charges in the various photodetecting subzones of the photodetecting device can therefore be read by several reading devices, or reading nodes, being able to operate independently or not from one another, for example controlled synchronously.

The additional information (relative to the difference or differences in electrical charges generated in the various photodetecting subzones) obtained with such a photodetecting device is indeed an information of intensity, but does not directly correspond to the intensity of the image formed by main optics coupled to the photodetecting device. Due to the possible overflow of the charges from one zone to another, i.e. of the possible circulation of charges between the potential wells formed by the first semiconductor portions, a dynamics, similar to that obtained with a conventional pixel of likewise dimensions, between the level of the noise and the saturation is obtained.

Due to the fact that the level of doping of the second semiconductor portion is higher than that of the semiconductor layer, the depletion zones around the first semiconductor portions does not extend or hardly extends in the second semiconductor portion, which makes it possible to have in this second semiconductor portion a potential that is quasi constant which is then used as a reference potential with regards to the potential barrier.

The second semiconductor portion may be arranged in the semiconductor layer.

The photodetecting device may further comprise at least as many separate reading devices as first semiconductor portions, with each of the reading devices able to be coupled to one of the first semiconductor portions and able to carry out a transfer of electrical charges stored in said one of first semiconductor portions to another semiconductor region.

Each reading device may comprise at least one transfer gate coupled to said one of the first semiconductor portions.

A width of the part of the semiconductor layer separating the first semiconductor portions may be such that the depletion zones between the first semiconductor portions overlap.

At least one fourth semiconductor portion doped according to the second type of conductivity may be arranged in the part of the semiconductor layer between the first semiconductor portions, and wherein a level of doping of the first semiconductor portions may be higher than a level of doping of the fourth semiconductor portion such that the potential level of the fourth semiconductor portion is less than the potential level of the second portion and of the semiconductor layer. Such a configuration makes it possible to carry out a wider potential barrier, and therefore technically easier to carry out and/or reproduce identically in the pixels.

In this case, a width of the part of the semiconductor layer separating the first semiconductor portions may be such that the depletion zones between the first portions do not overlap. This absence of overlapping of the depletion zones do not pose a problem for forming the potential barrier due to the fourth semiconductor portion present between the first semiconductor portions.

In a second embodiment, the photodetecting device may further comprise at least one control gate coupled to the part of the semiconductor layer and able to control a value of the potential between the first semiconductor portions. In this case, the circulation of the electrical charges between the first semiconductor portions can take place when a sufficient voltage is applied on the control gate, as such forming a channel that can be controlled between the first semiconductor portions. The levels of the potential barrier or barriers within the photodetecting device can furthermore be precisely defined via the voltage applied on the control gate.

The photodetecting device may comprise several second portions of semiconductor each delimiting, with the semiconductor layer, one of the first semiconductor portions.

The photodetecting device may comprise a plurality of first semiconductor portions arranged next to one another in the semiconductor layer by forming a matrix of a×b first semiconductor portions, with a and b whole numbers such as a≥1 and b≥2, or regularly arranged next to one another around a central axis of symmetry.

The photodetecting device may further comprise at least one focusing and/or filtering optics arranged across from the first, second and third portions of semiconductor.

An image sensor is also described comprising a plurality of pixels, each pixel comprising at least one photodetecting device such as described hereinabove.

The image sensor may further comprise electrical interconnections levels arranged between the semiconductor layer and focusing and/or filtering optics of the photodetecting devices. Such an image sensor corresponds to a "front-side" type sensor.

Alternatively, the semiconductor layer may be arranged between electrical interconnections levels and of focusing and/or filtering optics of the photodetecting devices. Such an image sensor corresponds to a "back-side" type sensor.

The photodetecting device may in particular be used for various applications such as:
- making high-performance pixels making it possible to correct, via calculations after the image capture, internal defects of the pixels or defects of the optics coupled to the pixels, by the combination of the various pieces of information supplied by the photodetecting devices;
- measuring the direction and the value of the gradient of the light captured in each pixel, in addition to the total intensity captured by the pixels, and this without microlens or other focus lens;
- capturing several colours in a single pixel;
- measuring the distance in a captured image, via carrying out calculations using the different pieces of information supplied by the pixels;
- making a plenoptic image sensor;
- making a device of the Shack-Hartmann type;
- measuring autofocus via phase contrast, with adding of a prism and of diaphragms coupled to the photodetecting devices;
- making a high-performance video sensor by variable readings of successive images, thanks to pixels of different internal configuration from image to image via different uses of the devices for reading information supplied by the photodetecting devices;
- making HDR ("High Dynamic Range") images by reading at different times of each photodetecting device of the same pixel.

The applications of the photodetecting devices may depend on the optics system and the settings chosen for all of the photodetecting devices.

BRIEF DESCRIPTION OF THE DRAWINGS

This invention will be better understood by reading the description of embodiments provide solely for the purposes of information and in no way restricted by making reference to the annexed drawings wherein.

Identical, similar or equivalent portions of the various figures described hereinafter bear the same numerical references in order to facilitate passing from one figure to another.

The various portions shown in the figures are not necessarily shown according to a uniform scale, in order to render the figures more legible.

The various possibilities (alternatives and embodiments) must be understood as not being exclusive from one another and able to be combined together.

DETAILED DESCRIPTION OF PARTICULAR EMBODIMENTS

Figure 6:
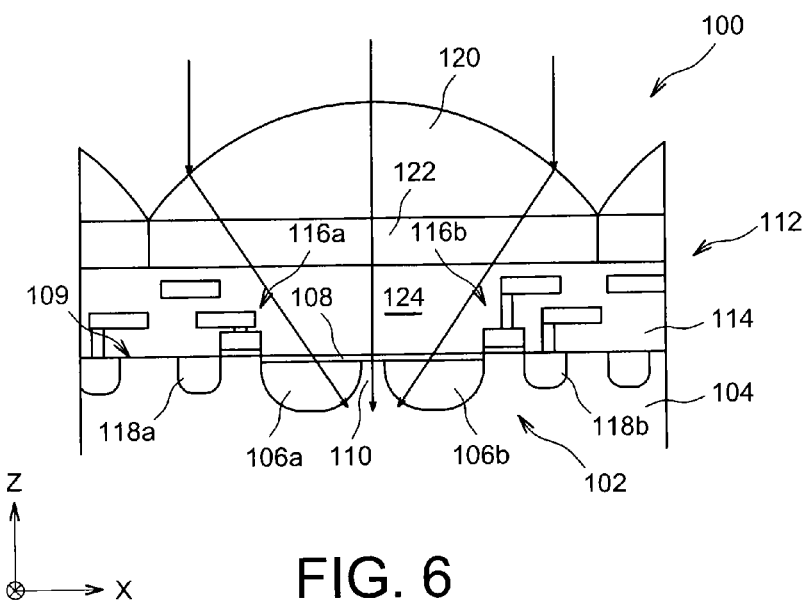
FIG. 6 diagrammatically represents a cross-section view of a pixel of an image sensor according to a first embodiment and comprising a photodetecting device.

Reference is first made to FIG. 6 which diagrammatically shows a cross-section view of a pixel of an image sensor 100 according to a first embodiment. Although not shown, the image sensor 100 comprises a pixel matrix wherein each pixel is substantially similar to the pixel shown in FIG. 6. The image sensor 100 here is of the CMOS type.

This pixel is made using a photodetecting device 102 comprising a photodetecting zone made in a semiconductor layer 104, comprising for example p doped silicon, doping for example between about $1.10^{14}$ atoms/cm$^3$ and $1.10^{16}$ atoms/cm$^3$ and forming an active layer of the photodetecting device 102. The photodetecting device 102 comprises, in this first embodiment, two first portions 106a and 106b of n doped semiconductor, doping for example equal to about $10^{17}$ atoms/cm$^3$, corresponding to two n doped regions of the layer 104. These two first portions 106a, 106b are separated from an interface 109, corresponding to an upper face of the layer 104, by a second portion 108 of p+ doped semiconductor, corresponding to a p+ doped region of the layer 104, doping for example between about $1.10^{18}$ atoms/cm$^3$ and $1.10^{20}$ atoms/cm$^3$. Each of the first portions 106a, 106b of n doping forms, with the p doping of the layer 104 and the p+ doping of the second portion 108, a set of p-n junctions of the photodetecting device 102.

A part 110 of the p doped semiconductor layer 104, is arranged between the two first portions 106a, 106b, allowing as such the formation of a potential barrier between the two first portions 106a, 106b. Alternatively, the doping of the semiconductor of the part 110 can be very slightly of type p−, i.e. very slightly less than the initial p doping of the layer 104. The distance (according to the X axis in FIG. 6) between the two first portions 106a and 106b is for example between about 0.2 μm and 1 μm. According to the application considered for the image sensor 100, the thickness (dimension according to the axis Z in FIG. 6) of the first portions 106a, 106b is for example between about 0.5 μm and 3 μm, and the length and the width (dimensions according to the axes X and Y in FIG. 6) of the first portions 106a, 106b are for example between about 0.3 μm and 10 μm.

Electrical interconnections levels 112 are arranged above the layer 104, on the upper face of the layer 104. These electrical interconnections levels 112 comprise in particular electrical connection lines, conducting vias electrically connecting the various electrical lines, as well as MOS transistor gates. These conductive elements are made in transparent dielectric layers 114, here $SiO_2$-based.

Two transfer gates 116a and 116b, forming two reading nodes, are made in the electrical interconnections levels 112 and are each electrically coupled to one of the two sets of p-n junctions. The first transfer gate 116a is electrically coupled to the p-n junctions formed by the n type first portion 106a with the p type layer 104 on the one hand, and with the part of the p+ type second portion 108 arranged against the first portion 106a on the other hand.

The second transfer gate 116b is electrically coupled to the p-n junctions formed by the n type second portion 106b with the p type layer 104 on the one hand, and with the part of the p+ type second portion 108 arranged against the second portion 106b on the other hand. The widths of the transfer gates 116a, 116b (dimension according to the X axis shown in FIG. 6) are for example between about 0.03 μm and 1 μm. The pixel further comprises transistors not shown in FIG. 6, of which the number depends on the structure of the pixel, for example of the 3T or 4T type.

The photodetecting device 102 further comprises an optics arranged across from its photodetecting zone. In this first embodiment, this optics comprises a microlens 120 able to focus luminous rays received on the p-n junctions of the photodetecting device 102, and a coloured filter 122 belonging to a Bayer matrix. The optics associated with the photodetecting device 102 can comprise other elements and/or different elements, such as prisms or diffraction gratings. A region 124 of the transparent dielectric layers 114 located across from the photodetecting zone of the photodetecting device 102, between the photodetecting zone and the optics, does not comprise electrical interconnections so that the light coming from this optics can arrive in the photodetecting zone of the photodetecting device 102 without reflection on the electrical interconnections. The image sensor 100 here is of the "front-side" type, i.e. it comprises the electrical interconnections levels 112 arranged between the semiconductor layer 104 and the focusing and filtering optics arranged across from the p-n junctions of the photodetecting device 102.

The first transfer gate 116a makes it possible to transfer the photogenerated charges, separated by the first set of p-n junctions (first portion 106a with the layer 104 and with the corresponding part of the second portion 108) and stored in the first portion 106a, to another region 118a of n doped semiconductor of the layer 104, and the second transfer gate 116b makes it possible to transfer the photogenerated charges, separated by the second set of p-n junctions (first portion 106b with the layer 104 and with the corresponding portion of the second portion 108) and stored in the first portion 106b, to another region 118b of n doped semiconductor of the layer 104. The two transfer gates 116a and 116b therefore form two reading nodes of the photodetecting device 102, able to function independently from one another or simultaneously, and as such extract two separate pieces of information supplied by a single pixel (corresponding to the photogenerated electrical charges, separated by each of the sets of p-n junctions and stored in each of the first portions 106). These distinct pieces of information make it possible, for example via a calculation carried out using these two signals, to provide improvements to the image supplied by the pixels, via the digital exploitation of this plurality of information obtained from each pixel.

Figure 7:
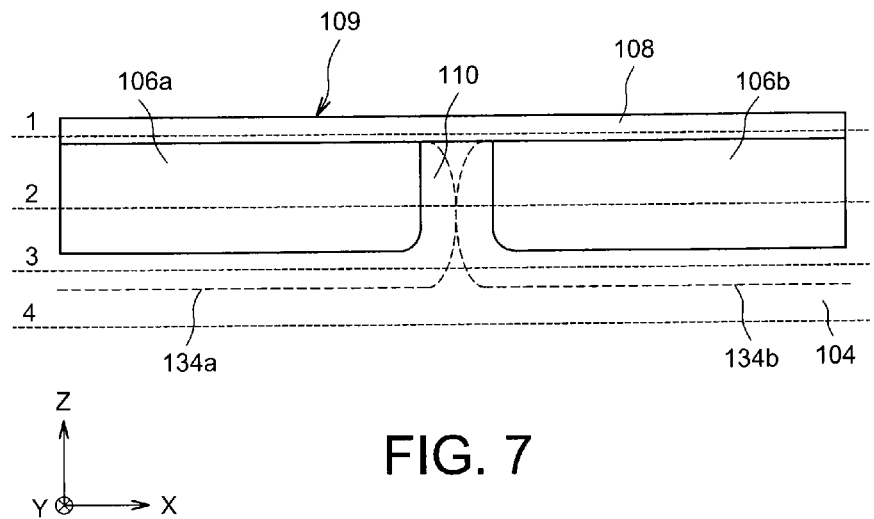
FIG. 7 diagrammatically represents the photodetecting zone of the photodetecting device shown in FIG. 6.

FIG. 7 shows the photodetecting zone of the photodetecting device 102 of FIG. 6. The dotted lines 134a and 134b symbolically delimit the depletion zones obtained around each of the first portions 106a, 106b. The two first portions 106a and 106b are here made rather close to one another so that the edges of these zones overlap and as such form a potential barrier that can be crossed by the electrical charges.

Figure 8:
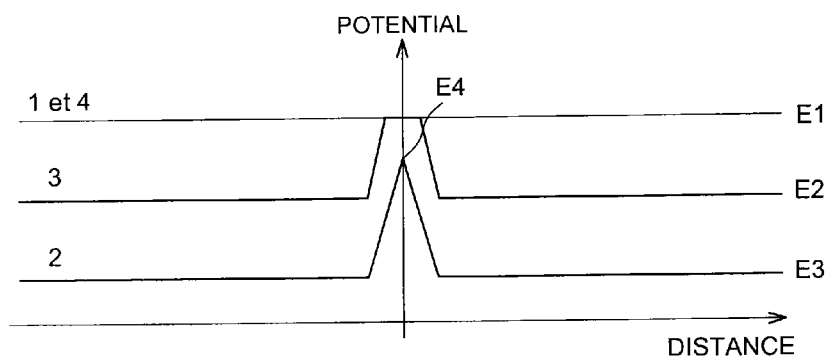
FIG. 8 shows the potentials in different panes of the photodetecting zone shown in FIG. 7.

FIG. 8 shows the potential variations obtained in the photodetecting zone of FIG. 7 on the various planes of this zone numbered 1 to 4. On planes 1 and 4 which are located respectively at the p+ doped second portion 108 and at the p doped layer 104, outside of zones 134a and 134b, the electrical potential is constant and equal to a first high value $E_1$. On plane 3 located at the layer 104 but passing in the zones 134a and 134b, the potential is, in the zones 134a and 134b, at a second value $E_2$ less than the first potential value $E_1$. Between the zones 134a and 134b, i.e. in the part 110 of the layer 104, the potential level reaches the first high value $E_1$. There is therefore, in this plane, a total separation between the two zones 134a and 134b, i.e. that cannot be crossed by electrical charges. In the plane 2, the potential in the first portions 106a and 106b has a third value $E_3$ less than the second value $E_2$. Between the first portions 106a and 106b, i.e. in the part 110 wherein the zones 134a and 134b come together, the value of the potential varies until it reaches a peak of value $E_4$ less than the first value $E_1$, and then returns to the third value, forming as such a potential barrier that can be crossed by the electrical charges.

As such, when charges accumulate on one side of this barrier in one of the potential wells, they are stored as long as their number is not enough to cross the potential barrier. On the other hand, when the number of charges is such that the level of the barrier is exceeded, the additional charges arriving from this side flow over to the other side of the potential barrier in the other potential well.

Figure 9:
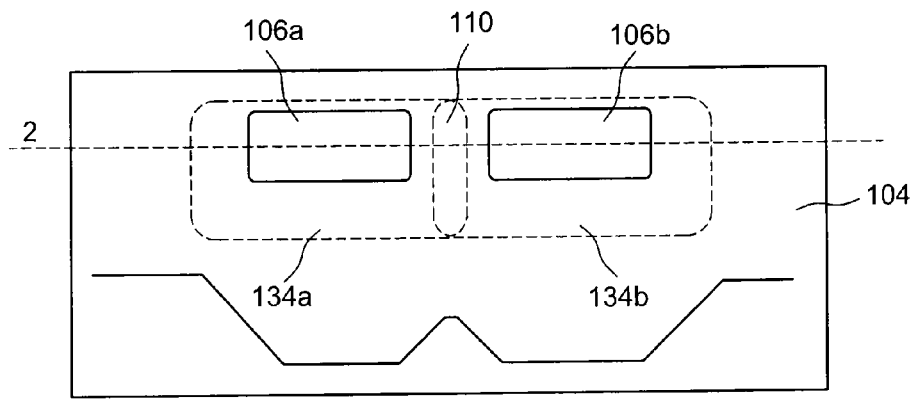
FIG. 9 shows the potential variation obtained along the photodetecting zone shown in FIG. 7.

FIG. 9 shows the potential variation obtained along the plan 2. It can be seen in particular in figure that the potential barrier formed at the part 110 has a level less than the potentials in the outside zones of the layer 104, outside of zones 134a and 134b. As such, the charges tend to cross over this potential barrier when the latter exceed the level of this barrier while still remaining in the potential wells formed as such.

Figure 1:
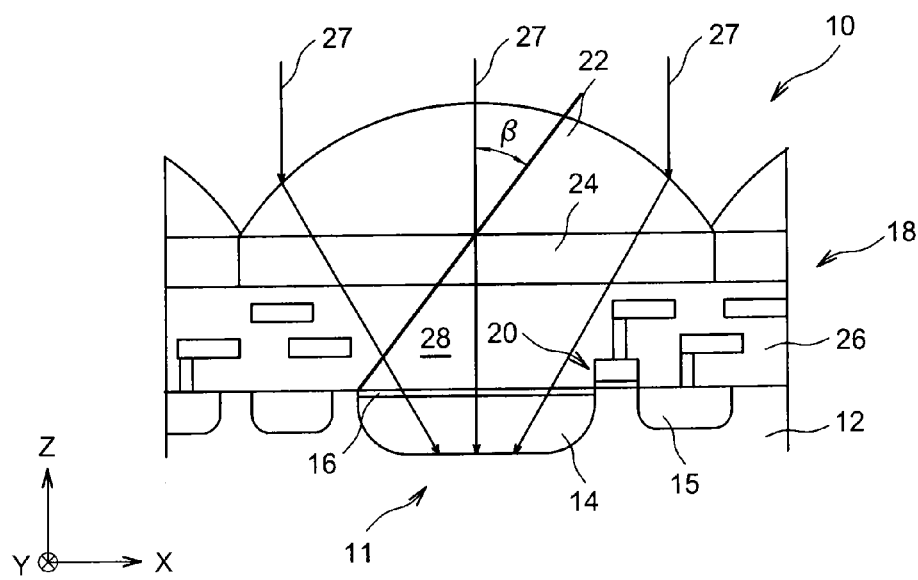
FIGS. 1, 4 and 5 diagrammatically represent cross-section views of image sensors according to prior art.
Figure 2:
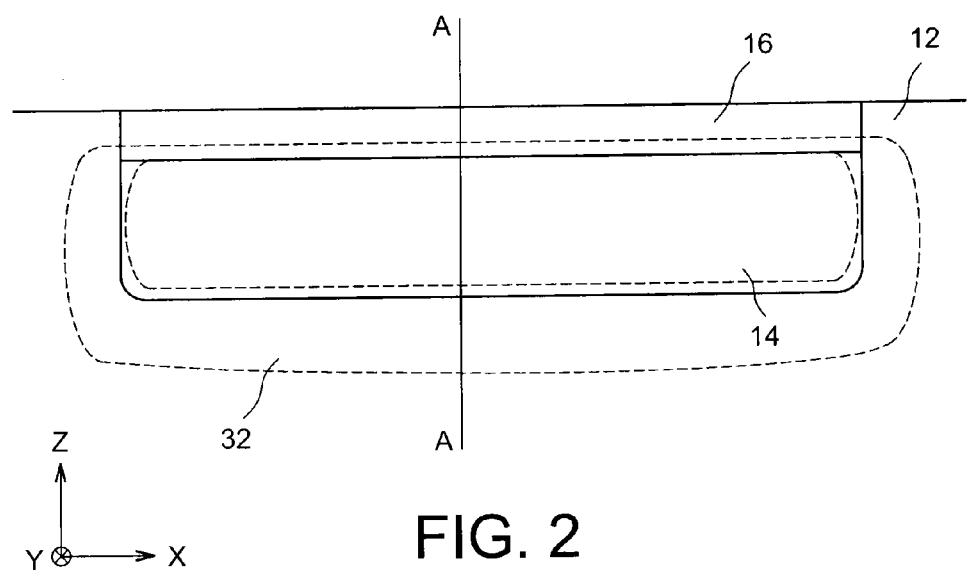
FIG. 2 diagrammatically represents a photodetecting zone of an image sensor according to prior art.
Figure 3:
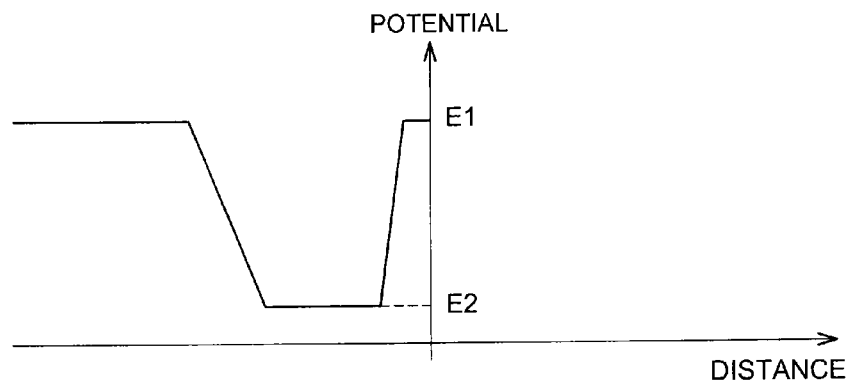
FIG. 3 shows the potential variation profile obtained in the photodetecting zone of FIG. 2.
Figure 4:
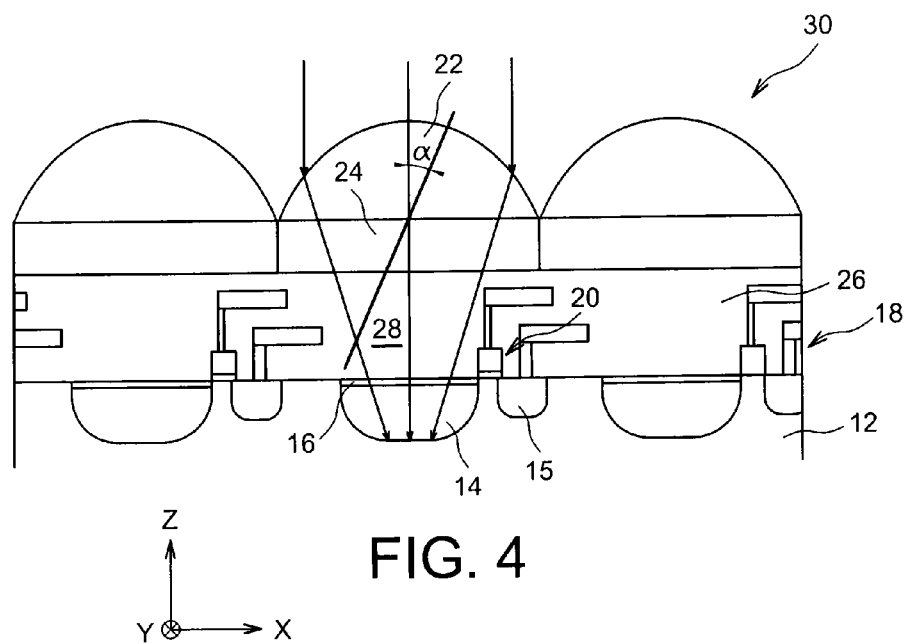
Figure 5:
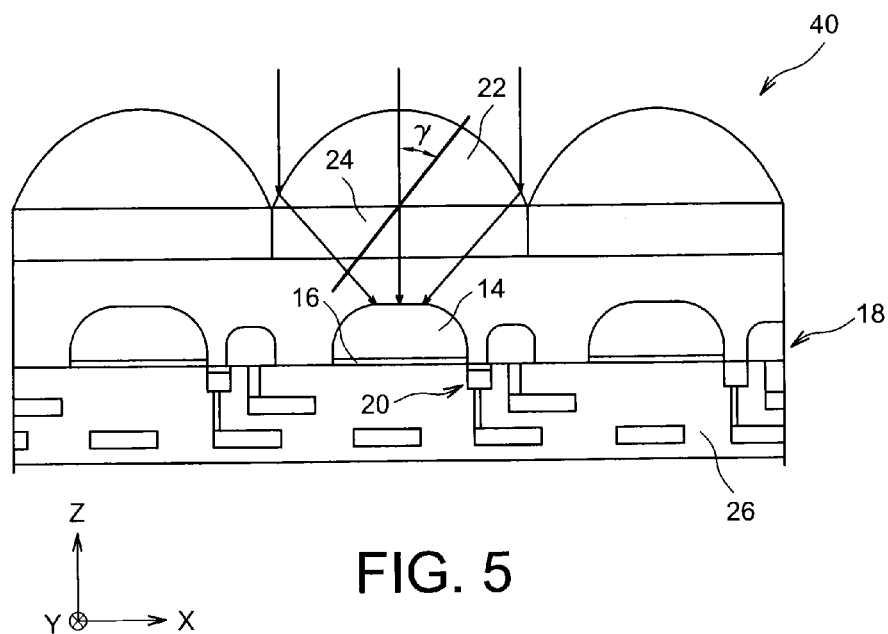

Each of the first portions 106a, 106b forms an electrical storage capacity. The photogenerated charges are stored in this capacity during the integration time of the image (corresponding to the idle time of the sensor 100). Due to the fact that the depletion zones around the two first portions 106a, 106b overlap at the part 110, if the potential well formed by one of these two first portions 106a, 106b approaches saturation of charges, then the charges will pass the potential barrier formed at the part 110 and flow into the other potential well formed by the other of the two first portions 106a, 106b. These two photodetecting sub-zones formed in this pixel can store as a total practically all of the charges as a single conventional photodetecting zone of a pixel of substantially similar dimensions. Through a simple adding of the two signals recovered, it is therefore possible to return to the signal given by a conventional pixel, i.e. without taking into account the information linked to the distribution of charges in one or the other parts of the p-n junction. Due to the overflow of the charges from one region to another, the same dynamic between the level of the noise and the saturation is retained in relation to a pixel of equivalent size but comprising a conventional p-n junction such as that shown in FIG. 1. A processing and a multiplexing of the signals outputted by the pixels of the sensor 100 can then be carried out.

The two transfer gates 116a, 116b can be controlled by the same control signal applied on these two gates, and as such work at the same speed and simultaneously. The two reading nodes formed as such can operate synchronously. In place of the transfer gates 116a, 116b, it is possible to call upon other reading devices such as transistors.

It is however possible to exploit differently these two pieces of information supplied by the photodetecting device 102. The additional information linked to the difference in charges generated between the two first portions 106a and 106b is indeed an information of intensity, but does not directly relate to the intensity of the captured image. This additional information can be used to deduce information therefrom linked to the focusing or to the field depth of the captured image by the image sensor 100.

This additional information can also be used to correct an optical defect of the sensor 100 or choose an optics system that is easier to make. This additional information supplied by each pixel also makes it possible to supply multiple improvements to the image, by adjustment of the optics system and/or processing of the information (for example via interpolations making it possible to increase the resolution of the image).

In the example of FIG. 6, the transfer gates 116a, 116b make it possible to transfer the signals read, i.e. the photogenerated charges, separated by the p-n junctions and stored in the first portions 106, to amplifiers, not shown in FIG. 6. Alternatively, it is possible for the two parts of the p-n junction to be directly coupled to amplifying transistors made in this case in place of the transfer gates 116a, 116b. Alternatively, and in particular in the case of small photodetecting zones (for example of 1 μm or less), it is possible to use some transfer gates of the photodetecting device differently, i.e. some of them will be used to transfer the charges to some of the amplifiers, and use the others inversely to push back the charges and make them cross the potential barrier or barriers between the p-n junctions. As such, it is possible to group together more charges on a few or even a single amplifying transistor, and therefore obtain a better signal to noise ratio for the pixel. A more legible image can as such be obtained with regards to the noise in low light, but less resolved, or an image that is well resolved, but possible with interference with a noise.

In an alternative embodiment, the dopings of the various portions of semiconductor can be of type inverse to those described hereinabove. As such, it is possible that the layer 104 and the part 110 comprise a n doped semiconductor, that the first portions 106a, 106b comprise a p doped semiconductor, and that the second portion 108 comprises a n+ doped semiconductor.

In addition, in the example described hereinabove in relation with FIG. 6, the photodetecting zone of the pixel comprises two first portions 106a, 106b of n doped semiconductor separated from the interface 109 by a second portion 108 of p+ doped semiconductor, and forming, with the second portion 108 and the layer 104, two sets of p-n junctions. The covering of the depletion zones of the junctions associated with the first portions 106a, 106b forms a potential barrier separating the potential wells formed by the first portions 106a, 106b. Alternatively, the photodetecting zone can comprise a more substantial number of first portions 106 of n doped semiconductor separated from the interface 109 by one or several second portions 108 of p+ doped semiconductor (or of first portions 106 of p doped semiconductor separated from the interface 109 by one or several second portions 108 of n+ doped semiconductor). More than two sets of p-n junctions are as such formed the first portions 106 of which form potential wells separated from another by potential barriers obtained by the covering of the depletion zones of these sets of p-n junctions.

Figure 10:
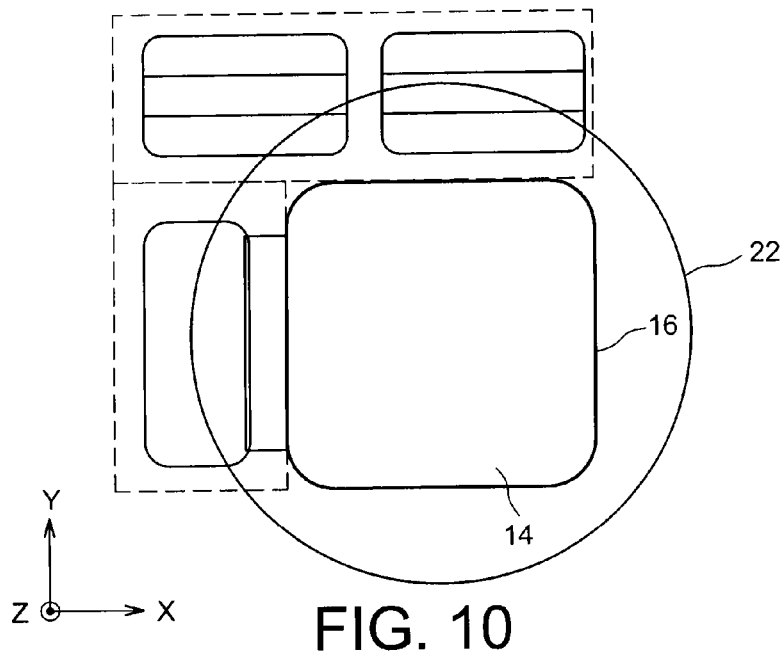
FIG. 10 diagrammatically represents a top view of a photodetecting device according to prior art.
Figure 11:
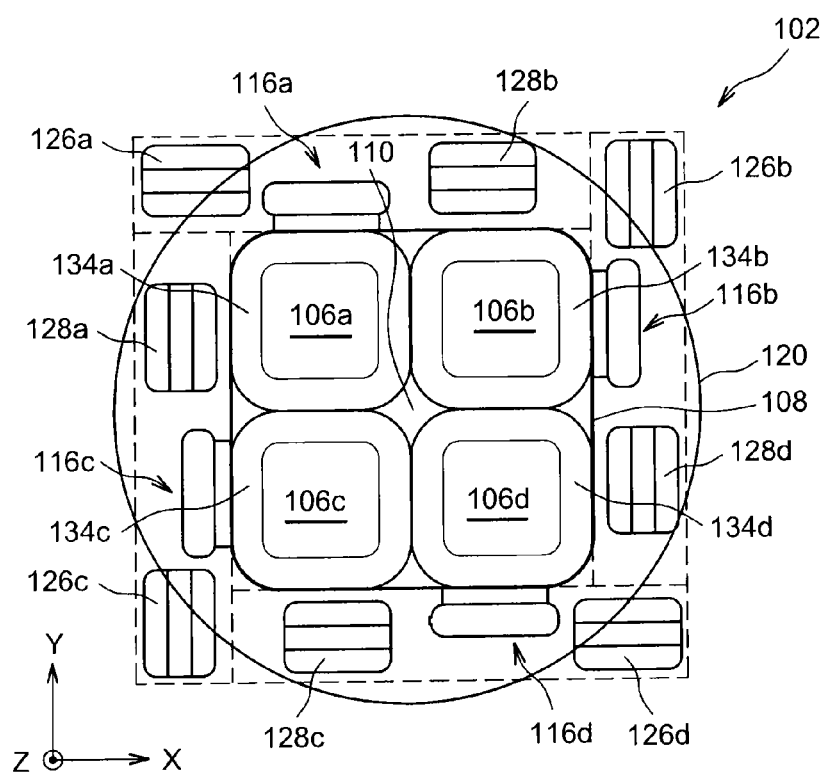
FIGS. 11 to 13 diagrammatically represent top views of photodetecting devices according to various alternative embodiments.

FIG. 11 diagrammatically represents a top view of a photodetecting device 102 of which the photodetecting zone is divided into four portions, or four photodetecting subzones, and comprises four n doped first portions 106a, 106b, 106c and 106d formed in the layer 104, arranged in matrix 2×2 and each of section (in the plane (X, Y) parallel to the face 109 of the layer 104) of a substantially rectangular shape. These four first portions 106a-106d are separated from the interface 109 by a second portion 108 of p+ doped semiconductor in contact with these four first portions 106a-106d and of section in the plane (X, Y) of a substantially rectangular shape. The four first portions 106a-106d are separated from one another by portions 110 of the p doped layer 104. Each of the depletion zones 134a-134d around each of these four first portions 106a-106d overlaps the depletion zones of the two first n doped portions 106a-106d that are adjacent to it, forming as such potential barriers between each of the first portions 106a-106d. Four reading nodes 116a-116d, formed here by transfer gates, are coupled to each of the four sets of p-n junctions formed as such. Finally, each of the four sets of p-n junctions is also coupled to transistors diagrammed by two transistors, referenced as 126a-126d and 128a-128d. For the purposes of comparison, a pixel with dimensions (in particular in the plane (X, Y)) similar to that shown in FIG. 11, but comprising a conventional p-n junction, i.e. not formed by several regions separated by potential barriers, is shown in FIG. 10.

With these four photodetecting subzones coupled to main optics comprising 4 filters distributed as in a base pattern of a Bayer matrix, it is possible to return to the coordinates that describe the colour in each sub-pixel by a linear combination adapted to the colours of the filters. According to another embodiment, without a filter in the main optics, by considering the four signals a, b, c and d outputted by these four photodetecting subzones, it is for example possible to calculate the module of the variation gradient between these subzones by the equation $\sqrt{(a-d)^2+(b-c)^2}$. The angle of direction of the gradient can also be calculated according to the equation $(a-d)/(b-c)$. Finally, the directional contrast can be calculated by the equation $\sqrt{(a-d)^2+(b-c)^2}/(a+b+c+d)$. Other modifications of the optics system located in front of the pixels can make it possible to extract other information by implementing other calculations.

Figure 12:
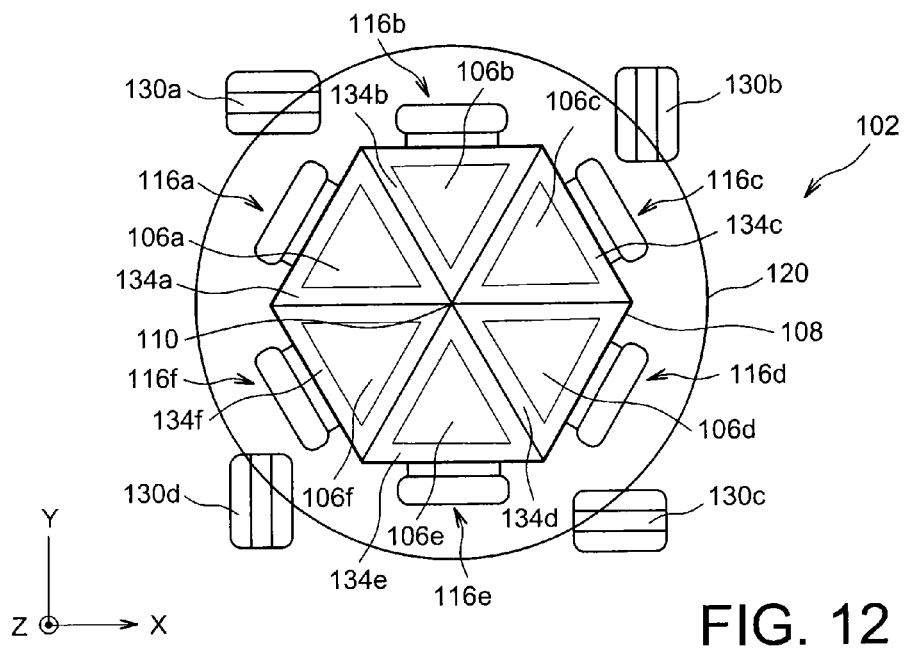

Each pixel can comprise a number of first semiconductor portions that is different from those described hereinabove, and/or first semiconductor portions arranged differently and/or of a different shape. FIG. 12 shows another embodiment of the photodetecting device 102 comprising here six first portions 106a to 106f of n doped semiconductor each of a substantially triangular, separated from the interface 109 by a p+ doped second portion 108 of substantially hexagonal shape. Depletion zones 134a-134f around these first portions 106a-106f are also of a substantially triangular and overlap with one another on the portions 110 of p doped semiconductor located between the first portions 106a-106f, forming potential barriers between the potential wells formed by the first portions 106a-106f. Each of the first portions 106a-106f is coupled to a reading node 116a-116f making it possible to carry out a transfer of the photogenerated charges in the part of the corresponding p-n junction. Four other transistors 130a-130d used for the processing of the read signals are shown in FIG. 12.

Figure 13:
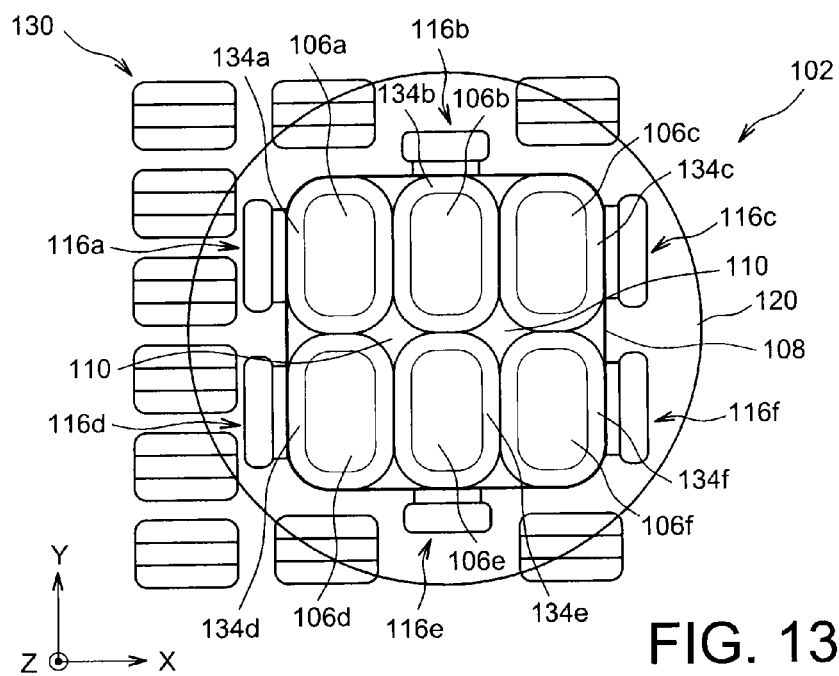

Another embodiment of the photodetecting device 102 is shown in FIG. 13. The photodetecting zone of the photodetecting device 102 here comprises six first portions 106a-106f of n doped semiconductor each of a substantially rectangular shape. The depletion zones 134a-134f around each of these first portions 106a-106f is in contact with two or three other depletion zones formed around the adjacent first portions 106a-106f, forming potential barriers in the n doped portions 110 of the semiconductor layer 104 located between the first portions 106a-106f, separating the potential wells formed by these first portions 106a-106f. The p+ doped second portion 108 in contact with the first portions 106a-106f is of a substantially rectangular shape and separates the interface 109 from first portions 106a-106f. Each of the first portions 106a-106f is coupled to a reading node 116a-116f making it possible to carry out a transfer of the charges generated in the portion of the corresponding p-n junction. Other transistors 130 used for the processing of the read signals are shown in FIG. 13.

In all of the embodiments described hereinabove, it is possible to lower the potential barrier or barriers formed between the first portions 106 by making, in the part or parts 110, of the n− doped regions.

Figure 14:
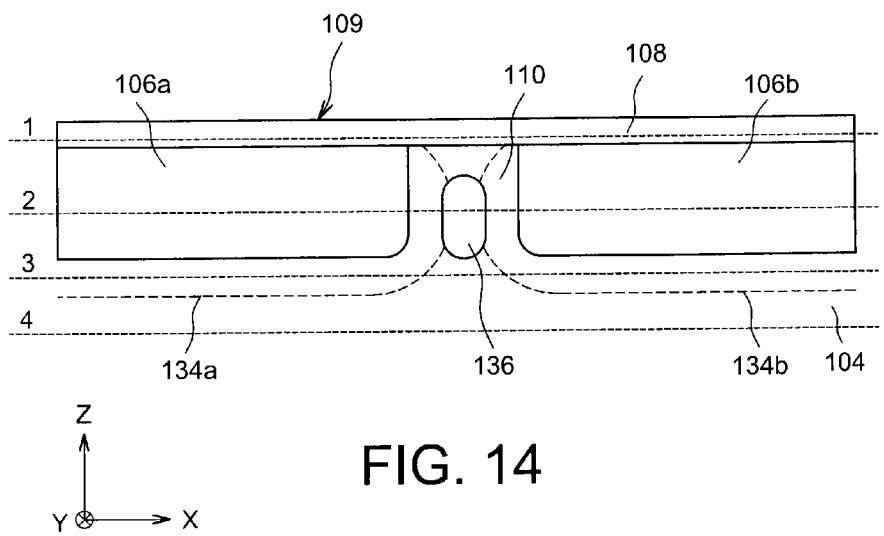
FIG. 14 diagrammatically represents a photodetecting zone of a photodetecting device according to an alternative embodiment.

The FIG. 14 diagrammatically represents a photodetecting zone comprising two photodetecting sub-zones made by two first portions 106a and 106b of n doped semiconductor made in the p doped layer 104 and separated from the interface 109 by a p+ doped second portion 108. A fourth portion 136 of n−doped semiconductor is formed in the part 110 located between the two first portions 106a and 106b.

Figure 15:
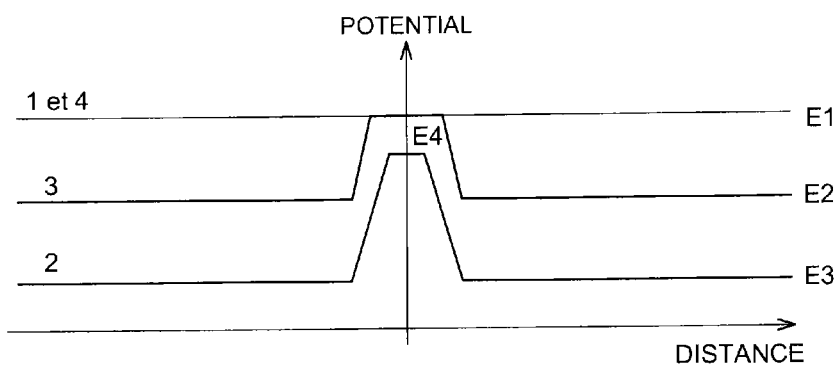
FIG. 15 shows the potentials in different planes of the photodetecting zone shown in FIG. 14.

FIG. 15 shows the potential variations obtained in the photodetecting zone of FIG. 14 at the levels of the various planes numbered 1 to 4. In relation to the potential variations described hereinabove in relation with FIG. 8, the two first portions 106a and 106b are more separated from one another, which increases, in the plane 3, the width of the plate to the first high value $E_1$ (which corresponds to the value of the potential in the planes 1 and 4). In addition, contrary to the case described hereinabove in relation with FIG. 8, the depletion zones 134a and 134b do not overlap with one another. However, thanks to the n− doped fourth portion 136 which is located between these zones, a potential barrier is indeed obtained due to the value $E_4$ of the potential in this portion 136 which is less than the value $E_1$ of the potentials in the regions p and p+.

Figure 16:
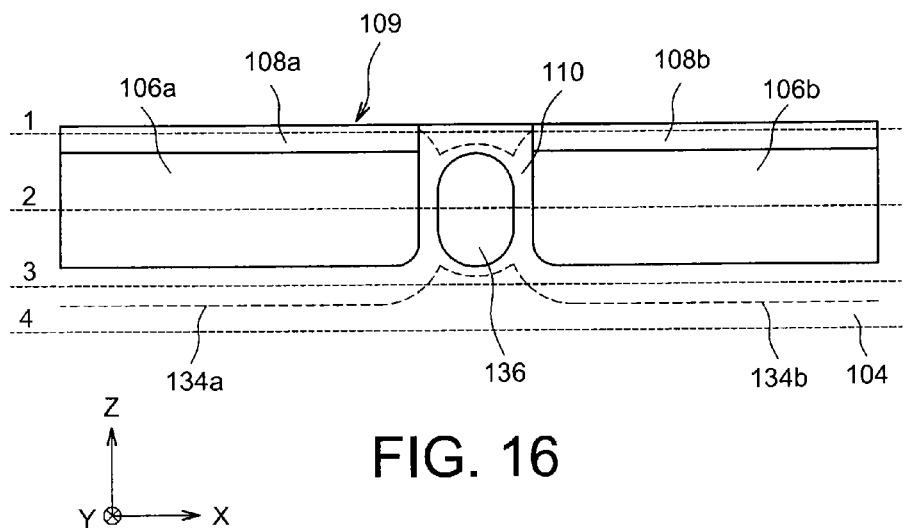
FIG. 16 diagrammatically represents a photodetecting zone of a photodetecting device according to another alternative embodiment.
Figure 17:
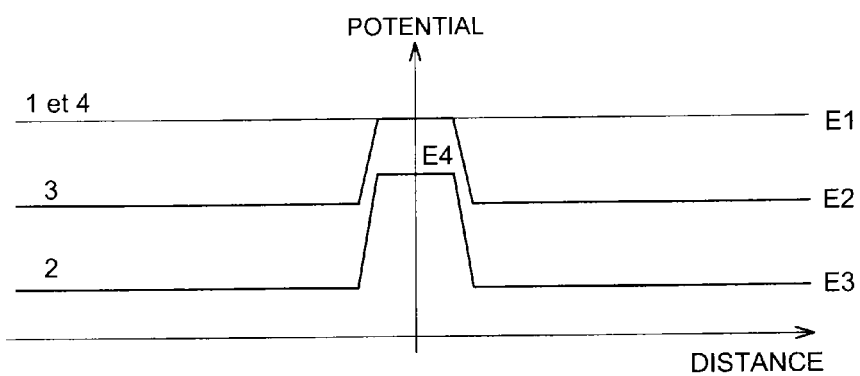
FIG. 17 shows the potentials in different planes of the photodetecting zone shown in FIG. 16.

FIG. 16 diagrammatically represents a photodetecting zone comprising two photodetecting sub-zones carried out by two n doped first semiconductor portions 106a and 106b made in p doped layer 104 and separated from the interface 109 by a separate p+ doped second portion 108a and 108b. A fourth portion 136 of n− doped semiconductor is formed in the part 110 located between the two first portions 106a and 106b. This fourth portion 136 is wider than that located in the photodetecting zone described hereinabove in relation with FIG. 14, which results in the obtaining of a wider potential barrier, and therefore easier to carry out, as shown in FIG. 17.

Figure 18:
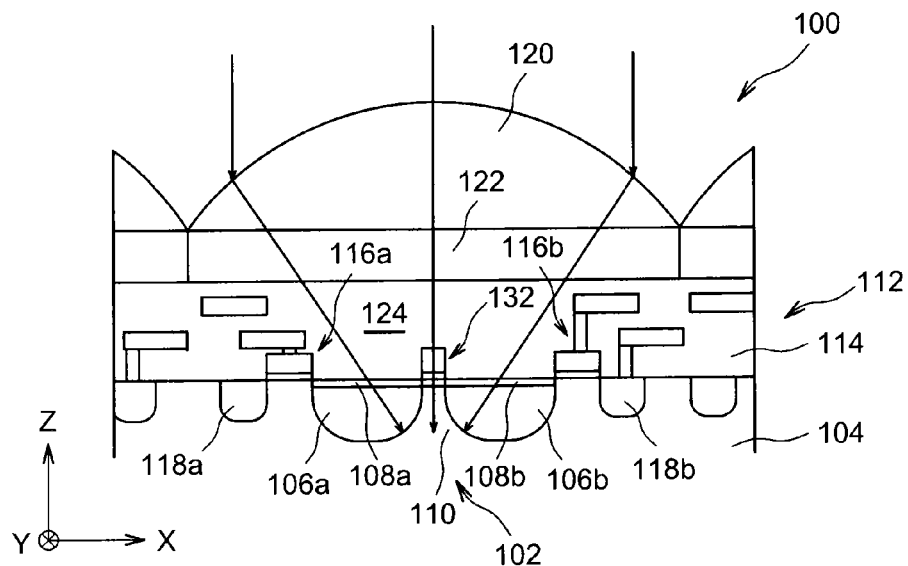
FIGS. 18 and 19 diagrammatically represent cross-section views of a pixel of an image sensor according to a second and a third embodiment, and each comprising a photodetecting device.

FIG. 18 diagrammatically represents a cross-section view of a pixel of the image sensor 100 according to a second embodiment.

Contrary to the image sensor 100 described hereinabove in relation with FIG. 6, the first portions 106a and 106b of n doped semiconductor are separated from one another such that the depletion zones formed around these first portions 106a and 106b do not overlap. In addition, each of the first portions 106a and 106b is separated from the interface 109 by a separate second portion 108a and 108b of p+ doped semiconductor. So that the potential barrier formed by the part 110 can be crossed by the charges located in one of the potential wells formed by the first portions 106a, 106b and circulate between these potential wells, a control gate 132 is arranged on the part 110. This control gate makes it possible to control the level of this potential barrier by the effects of electric field obtained by applying a voltage on this control gate 132. This control gate 132 is of a structure similar to that of the gate of an MOS transistor (comprising a conductive portion arranged on a dielectric thin layer referred to as gate dielectric).

When no voltage is applied on the control gate 132, the charges cannot pass from one of the first portions 106a and 106b to the other because the potential is equal, in the part 110, to the first high value $E_1$ corresponding to the potential in the regions p and p+. However, when the voltage applied on the control gate 132 forms a channel in the part 110 between the first portions 106a and 106b, this lowers the potential and thus forms a potential barrier that can be crossed by the electrical charges and of which the level can be adjusted according to the voltage applied on the control gate 132. As such, it is possible to control for example the overflow of the charges from one of the first portions 106a and 106b to the other. By applying a sufficiently strong voltage on the control gate 132, it is possible to entirely suppress the potential barrier between the first portions 106a and 106b, with the photodetecting zone then forming a single potential well equivalent to a single pixel.

The control gate 132 is made more preferably transparent to the light, the conductive portion of this gate can for example be made with ITO (indium tin oxide), so that the light captured in the pixel can reach the photodetecting zone of the pixel without being reflected by the control gate 132.

This second embodiment can be applied to all of the photodetecting devices described hereinabove, with each potential barrier being associated with a control gate, with the various control gates able to be controlled independently or not from one another. It is also possible to have a photodetecting device comprising one or several potential barriers similar to that described hereinabove in relation with FIG. 6 and one or several potential barriers similar to that described in this second embodiment (i.e. controlled by control gates).

Figure 19:
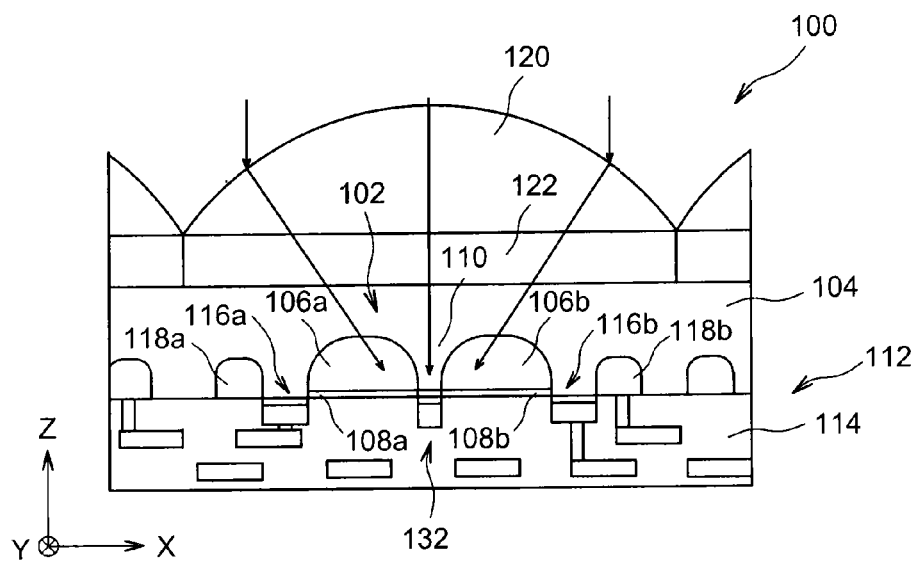

FIG. 19 diagrammatically represents a cross-section view of a pixel of the image sensor 100 according to a third embodiment.

Contrary to the image sensor 100 described hereinabove in relation with FIGS. 6 and 18, the image sensor 100 here is of the "back-side" type, with the semi-conducting layer 104 located between the optics and the electrical interconnections levels 112. As in the image sensor 100 described hereinabove in relation with FIG. 18, the first portions 106a and 106b of n doped semiconductor are separated by a part 110 of the p doped semiconductor layer 104 allowing for the establishment of a potential barrier controlled by the control gate 132. Due to the fact that the control gate 132 is made in the electrical interconnections levels 112 which here are not intended to be passed through by the light received by the pixel, this control gate 132 can be carried out indifferently using materials that are transparent or not, and advantageously be made from the same materials as those used to carry out the gates of the other MOS transistors of the image sensor 100. In addition, compared to a front-side image sensor, such a back-side image sensor can comprise a higher number of electrical interconnections due to the fact that it is not necessary to retain, across from the photodetecting zones, regions devoid of interconnection elements such as the regions 124 described hereinabove.

The image sensor 100 described hereinabove in relation with the FIG. 6 can also be made such that it is of the "back-side" type.

In all of the embodiments of the photodetecting device 102 described hereinabove, the various parts of the p-n junctions of the photodetecting device 102 are arranged next to one another in accordance with a symmetrical distribution in the device (axial symmetry in the plane (X,Y) in the examples of FIGS. 6, 11 and 13, and central symmetry in the example of FIG. 12), in particular with regards to the optics of the pixel (microlens 120 and filter 122 in the examples). The number, the shape and the arrangement of the various portions of the p-n junctions, i.e. of the first portions of semiconductor 106, are parameters chosen according to the type of additional information desired. As such, the embodiments described hereinabove in relation with FIGS. 11 and 13 make it possible to obtain directional information, i.e. make it possible to have more information according to a first direction (3 photodetectors) than according to the other directions (2 photodetectors). The example described hereinabove in relation with FIG. 12 makes it possible to obtain information of isotropy, and as such verify the variation according to 3 directions in the plane of the detector and the differences between these directions.

When the p-n junctions are formed of more than two portions, the control gates making it possible to control the potential barriers can operate independently from one another and by their controlling, allow for a more versatile transfer of the charges and more variable over time. For example, it is possible to carry out a transfer of all the charges to the same first portion 106 so that the charges are processed by the same amplifier, or that the charges located in the various first portions 106 are successively transferred to the same amplifier. This can be implemented image by image over time in order assess and correct the disparities between the various elements of the pixel.

In all of the embodiments and example embodiments described hereinabove, the transistors can be mutualised between adjacent pixels of the image sensor 100. For example, the transistors 126, 128 and 130 described hereinabove in relation with FIGS. 11 to 13 can be common to the adjacent pixels to the pixel described in these figures. The pixels can be read one by one (or line by line) and the known diagrams for mutualising transistors used successively between pixels can operate between the new adjacent pixels.

In all of the embodiments and example embodiments described hereinabove, the MOS transistors and gates (control, transfer, etc.) can be carried out with a gate length between about 0.1 µm and 1 µm.

All of the parts of the p-n junctions are not necessarily used for all the readings of pixels.

The making of the photodetecting devices described hereinabove is obtained by implementing steps on the field of microelectronics: masking, implantation of dopants, photolithography, etching, etc.

Additional elements making it possible to prevent any overflow of charges between the various pixels of the image sensor (anti-glare element, or anti-blooming) can be made between the pixels of the image sensor. Such an anti-glare effect can consist in polarising the reading gates in such a way as to create a very light channel over where the potential barrier or barriers between the photodetecting zones, while still maintaining the other side of the gate at a constant potential.

The invention claimed is:

1. Photodetecting device comprising at least:
    a semiconductor layer doped according to a first type of conductivity;
    two first semiconductor portions doped according to a second type of conductivity opposed to the first type of conductivity, distinct and separated from one another, and arranged in the semiconductor layer next to one another;
    a second semiconductor portion doped according to the first type of conductivity with a level of doping greater than that of the semiconductor layer and delimiting, with the semiconductor layer, the first semiconductor portions such that the first semiconductor portions form, with the semiconductor layer and the second semiconductor portion, p-n junctions,
    wherein at least one part of the semiconductor layer doped according to the first type of conductivity separates the first semiconductor portions in such a way that depletion zones between the first semiconductor portions form at least one potential barrier of which the level is less than the potential level of the second semiconductor portion and less than the potential level of the semiconductor layer, and wherein:
    at least one fourth doped semiconductor portion according to the second type of conductivity is arranged in the part of the semiconductor layer between the first semiconductor portions, and wherein a level of doping of the first semiconductor portions is higher than a level of doping of the fourth semiconductor portion such that the potential level of the fourth semiconductor portion is less than the potential level of the second portion and of the semiconductor layer, or
    the photodetecting device further comprises at least one control gate coupled to the part of the semiconductor layer and able to control a value of the potential between the first semiconductor portions.

2. Photodetecting device according to claim 1, wherein the second semiconductor portion is arranged in the semiconductor layer.

3. Photodetecting device according to claim 1, further comprising at least as many separate reading devices as first semiconductor portions, with each of the reading devices being coupled to one of the first semiconductor portions and able to carry out a transfer of electrical charges stored in said one of first semiconductor portions to another semiconductor region.

4. Photodetecting device according to claim 3, wherein each reading device comprises at least one transfer gate coupled to said one of the first semiconductor portions.

5. Photodetecting device according to claim 1, wherein a width of the part of the semiconductor layer separating the first semiconductor portions is such that the depletion zones between the first semiconductor portions overlap.

6. Photodetecting device according to claim 1, wherein a width of the part of the semiconductor layer separating the first semiconductor portions is such that the depletion zones between the first portions do not overlap.

7. Photodetecting device according to claim 1, comprising several second portions of semiconductor each delimiting, with the semiconductor layer, one of the first semiconductor portions.

8. Photodetecting device according to claim 1, comprising a plurality of first semiconductor portions arranged next to one another in the semiconductor layer by forming a matrix of a×b first semiconductor portions, with a and b whole numbers such that a≥1 and b≥2, or regularly arranged next to one another around a central axis of symmetry.

9. Photodetecting device according to claim 1, further comprising at least one focusing and/or filtering optics arranged across from the first and second, and a third portion of semiconductor.

10. Image sensor comprising a plurality of pixels, each pixel comprising at least one photodetecting device according to claim 1.

11. Image sensor according to claim 10, further comprising electrical interconnections levels arranged between the semiconductor layer and focusing and/or filtering optics of the photodetecting devices.

12. Image sensor according to claim 10, wherein the semiconductor layer is arranged between electrical interconnections levels and focusing and/or filtering optics of the photodetecting devices.

13. The device of claim 1, wherein the first semiconductor portions correspond to photodetecting subzones which are in electrical contact with one another during a capture of images.

14. The device of claim 1, wherein the first semiconductor portions correspond to photodetecting subzones such that, when one of them approaches saturation of charges during an image capture, these charges pass said at least one potential barrier and go in the other photodetecting subzone.

15. The device of claim 1, wherein the value of the potential between the first semiconductor portions is controlled by said at least one control gate such that a channel enabling a circulation of electrical charges between the first semiconductor portions can be formed and controlled via a voltage applied on the control gate.

* * * * *